(12) United States Patent
Casarsa (10) Patent No.: US 7,702,983 B2
(45) Date of Patent: Apr. 20, 2010

(54) SCAN COMPRESSION ARCHITECTURE FOR A DESIGN FOR TESTABILITY COMPILER USED IN SYSTEM-ON-CHIP SOFTWARE DESIGN TOOLS

(75) Inventor: Marco Casarsa, Vaprio d'Adda (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 473 days.

(21) Appl. No.: 11/744,631

(22) Filed: May 4, 2007

(65) Prior Publication Data

US 2007/0283200 A1 Dec. 6, 2007

(30) Foreign Application Priority Data

May 4, 2006 (EP) .................................. 06009228

(51) Int. Cl.
*G01R 31/28* (2006.01)
(52) U.S. Cl. ........................................ 714/729; 714/726
(58) Field of Classification Search .................. None
See application file for complete search history.

(56) References Cited

U.S. PATENT DOCUMENTS

2003/0131298 A1  7/2003  Rajski et al. ................ 714/738

2007/0050693 A1 *  3/2007  Kiryu .......................... 714/733
2008/0313513 A1 * 12/2008  Gizdarski .................... 714/729

FOREIGN PATENT DOCUMENTS

EP          1536244       6/2005
WO          01/38889      5/2001

* cited by examiner

*Primary Examiner*—Kevin L Ellis
*Assistant Examiner*—Guerrier Merant
(74) *Attorney, Agent, or Firm*—Lisa K. Jorgenson; Allen, Dyer, Doppelt, Milbrath & Gilchrist, P.A.

(57) ABSTRACT

A scan compression architecture for a design for a testability compiler used in system-on-chip software design tools includes a first scan architecture including a first scan compressor/decompressor configuration connected to a first predetermined set of pins, and a second scan architecture including a second scan compressor/decompressor configuration connected to a subset of the pins. The first scan architecture is selectively enabled for executing a scan test with a low time. The second scan architecture is for executing a scan test with high parallelism.

31 Claims, 7 Drawing Sheets

SCAN COMPRESSION ARCHITECTURE FOR A DESIGN FOR TESTABILITY COMPILER USED IN SYSTEM-ON-CHIP SOFTWARE DESIGN TOOLS

FIELD OF THE INVENTION

The present invention relates in general to a design for testability structure inserted into a system on a chip (SoC). More specifically, the invention relates to a scan compression architecture for a design for a testability compiler used in system-on-chip software design tools.

The invention further relates to a method of designing a scan compression architecture through a design for a testability compiler used in a system-on-chip. The invention particularly, but not exclusively, relates to modification of the flow of a standard design for a testability compiler tool available on a conventional software tool to implement the scan compression architecture, as may be developed for automotive segments.

The following description is made with reference to this field of application for convenience of explanation only, and without limiting the scope of the invention.

BACKGROUND OF THE INVENTION

The testing cost for complex system-on-chip (SoC) integrated circuits (ICs) is growing fast, especially in the case of devices including non-volatile memory portions. To reduce the test cost of complex SoC ICs, such as an SoC including an embedded flash memory, three different possibilities can be chosen: reduce the embedded flash intrinsic test time; insert a partial/full BIST (built-in self test) approach; and increase the test parallelism by probing a small subset of pins. The first two approaches can have a big impact on the device area, so the third approach is preferably the preferred one.

Using a standard software tool and including a compressor/decompressor architecture, it is possible to perform tests with a plurality of scan chains. More particularly, a compression architecture generally comprises a decompressor receiving test input bit streams from a set of pins to load the plurality of scan chains. The SoC is tested with the scan chains and produces corresponding test output bit streams. A compressor receives the test output bit streams, compress it in a scan output that is compared to a predicted pattern to determine whether an error occurred during testing.

Using the architecture described above it is possible to perform tests on different levels of the device. For example, the tests include tests at the electrical wafer level executed for each single wafer, and tests at the package level executed as a final step before the delivery of the package. In this compression architecture the same set of pins and the same plurality of scan chains is used to execute the tests on a package level and on a wafer level.

A disadvantage of this architecture is that the parallelism of the tests at the wafer level is very limited because a large number of bits involved in the package level test are used for the wafer level test. Two specific constraints should be taken in consideration: the test time and the test parallelism.

More particularly, since the entire pins of the package are typically probed at the package level test, it is important to reduce the test time during a package level test. At the same time, since a plurality of devices on the same wafer may be tested during the electrical wafer test, it is important to improve the test parallelism in the electrical wafer test.

With an architecture comprising a specific configuration of pins and of scan chains it is only possible to obtain a compromise between the test parallelism and the test time, or to advantage one constraint to the detriment of the other.

A specific design tool available in standard software tool and known as a design for testability compiler that allows implementation of different architectures to improve the flexibility of the design for testability structures is inserted in the SoC for specific test requirements.

A known available approach is the multi-mode architecture that allows the implementation of multiple scan chains configurations (or modes). It is common in this environment to have two configurations: a standard scan chain mode and a burn-in scan chain mode.

Figure 1:
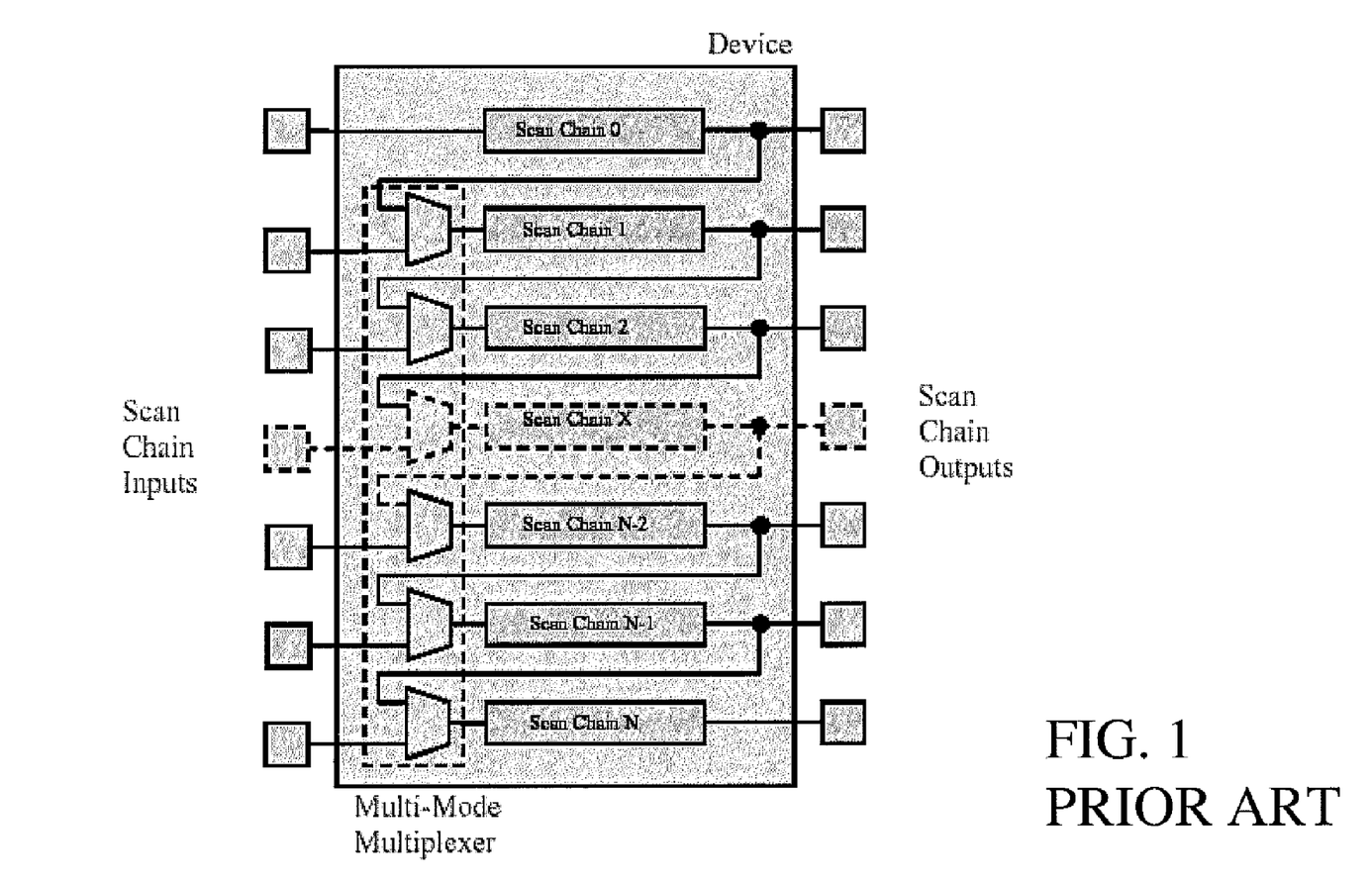
FIG. 1 schematically shows a scan compression multi-mode architecture with 1 or N scan chains according to the prior art.

In the standard scan chain mode the number of internal scan chains depends on the maximum number of available I/O pins at the top level and on the test equipment constraints. These features are schematically shown in FIG. 1 which provides an improved architecture with N scan chains.

In the burn-in scan chain mode all internal scan chains are serially connected in a single long scan chain by a multiplexer for allowing a higher parallelism in the testing step since more devices can be tested in parallel. FIG. 1 also shows the alternative approach wherein a multiplexer shown by the dotted line connects all the chains in a single long chain.

A scan architecture may be optionally available for allowing insertion of a decompression multiplexer logic block between fewer external scan chain inputs and the internal scan chain inputs, along with a compression XOR logic based block between the internal scan chain outputs and fewer external scan chain outputs.

Figure 2:
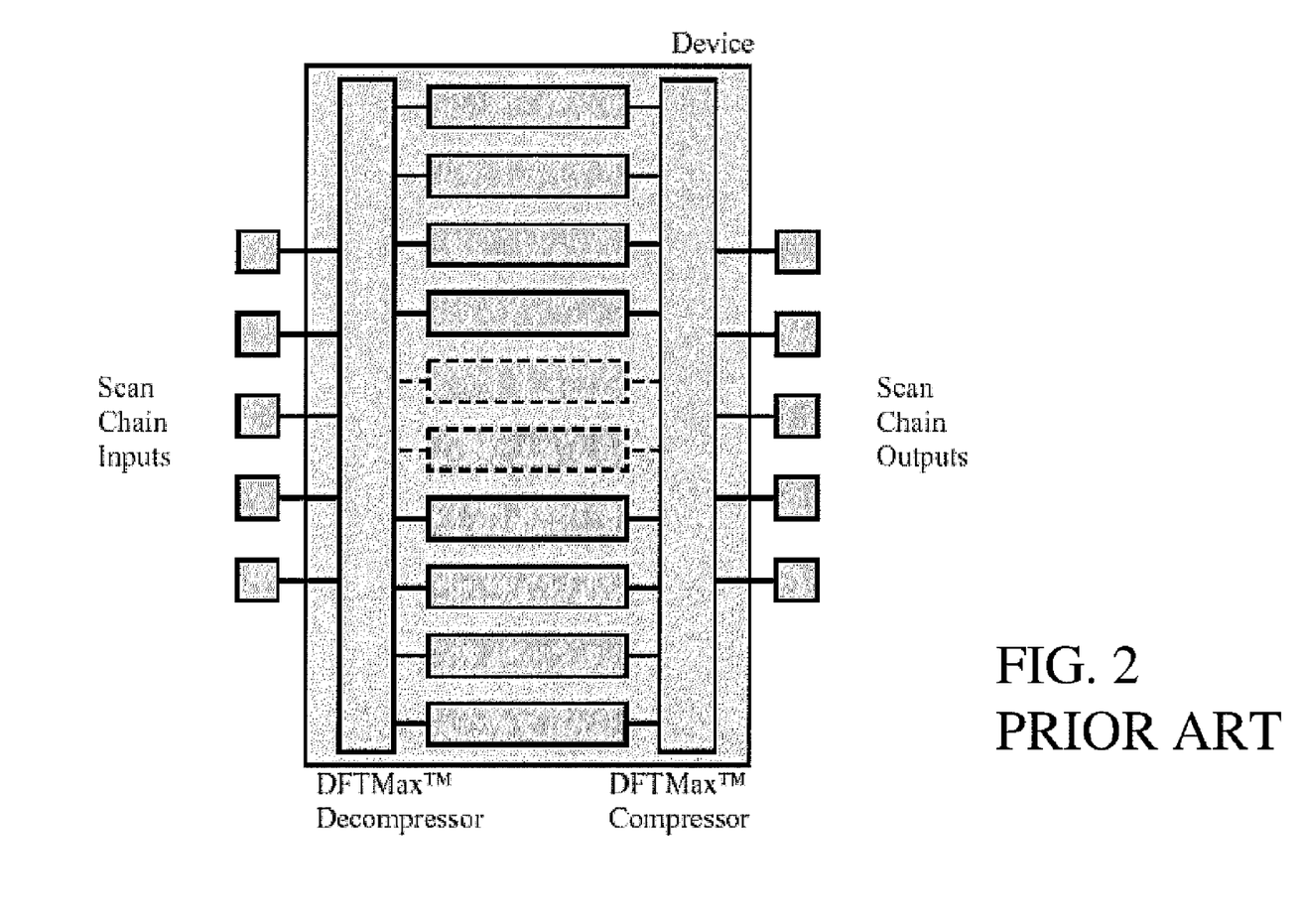
FIG. 2 schematically shows another compression scan architecture according to the prior art.

This further available approach is schematically shown in FIG. 2 wherein the main hardware portions are shown. The decompression multiplexer connects several internal scan chain inputs to a single external scan chain input for allowing a higher degree of parallelism in the testing step, quantified in a compression factor parameter.

These known approaches still present some limitations, mainly when there is a need to perform testing steps requiring different degrees of parallelism. More specifically, the increasing complexity of the current system-on-chip (SoC) integrated circuits (ICs), especially but not only those including embedded Flash memories, along with the increasingly stringent quality requirements, gives rise to a consequential increase of the overall test cost which does not support the current trend to reduce as much as possible the device test time/cost.

The problem is particularly relevant when the inserted deign for testability structure needs to be used both in testing steps where a high degree of parallelism is required, for example in electronic wafer level testing, and in testing steps where a low time test is required, for example in the package level test.

SUMMARY OF THE INVENTION

In view of the foregoing background, an object of the present invention is to provide a testability architecture design that meets the above stated requirements, and has structural and functional characteristics which allows for a reduction in the testing cost. The testing cost may be in terms of test time and test data volume for complex system-on-chip ICs. Structural and functional characteristics may also allow for improvement in the parallelism of the test for overcoming the limits which still affect the deign for testability structures realized according to the prior art.

This and other objects, advantages and features in accordance with the present invention are provided by an approach that increases the test parallelism, especially but not exclusively at the electrical wafer level test, by probing only a limited subset of pins. To reduce the test time, especially but not exclusively at the package level test, a high number of pins may be probed, and potentially all the pins may be probed.

This is obtained by providing at a TOP level a dual mode scan hardware architecture that uses two different scan compressor configurations. A first configuration, named compressor/decompressor $MIN_{CONF}$ configuration, may be used during the electronic wafer level test to increase the degree of parallelism of the testing. A second configuration, named compressor/decompressor configuration $MAX_{CONF}$, may be used during the package level test to reduce the testing time.

The technical problem is addressed by an improved scan compression architecture for a design for testability compiler used in system-on-chip software design tools comprising at least a first scan architecture including a first scan compressor/decompressor configuration connected to a first predetermined set of pins, and a second scan architecture including a second scan compressor configuration connected to a subset of the pins. The first scan architecture may selectively enable execution of a scan test with a low time at the package level, and the second scan architecture may execute a scan test with high parallelism at the wafer level.

Another aspect of the invention is directed to a method of designing a scan compression architecture through a design for a testability compiler as described above.

BRIEF DESCRIPTION OF THE DRAWINGS

The characteristics and advantages of the proposed improved scan hardware architectural approach according to the invention will be apparent from the following description of embodiments thereof given by way of indicative and non-limiting examples with reference to the annexed drawings. In such drawings.

DETAILED DESCRIPTION OF THE PREFERRED EMBODIMENTS

With reference to the figures, and in particular to the example shown in FIGS. 3 to 7, an improved scan compression architecture according to the present invention is represented by reference numeral 1. Reference numeral 1 corresponds to the architecture from its initial set up to its final layout through the design activity performed by a design for testability compiler.

This improved scan compression architecture 1 has been specifically designed for a design for a testability compiler incorporated into a standard software tool. More particularly, the improved scan compression architecture 1 is described with reference to a specific design for a testability compiler, and is included in a software standard tool known as Synopsys. This is only for illustration purposes and does not limit the scope of the present invention.

As will be apparent from the following description and claims, the improved scan compression architecture 1 may be realized through the design activity performed by any design for a testability compiler provided by any software standard tool known as Synopsys.

Advantageously, this improved scan compression architecture includes a Core Logic 2 with at least a couple of scan compressor configurations, a compressor/decompressor configuration $MIN_{CONF}$ and a compressor/decompressor configuration $MAX_{CONF}$ as will be clearer understood by the following description.

The basic idea of the architecture is that of inserting into the SoC IC two different compressors and decompressors. A first compressor/de-compressor, hereafter indicated as $MIN_{CONF}$, has the target to allow the application of scan patterns with a subset of pins to allow high parallelism, for example in the electrical wafer level test. A second compressor/decompressor, also hereafter indicated as $MAX_{CONF}$, has the target to reduce as much as possible the test time and test data volume, in which substantially all the pins are connected to the test equipment, for example in the package level test.

More particularly, the improved scan compression architecture comprises at least a first scan architecture including a first scan compressor/decompressor configuration $MAX_{CONF}$ connected to a first predetermined set of pins, and a second scan architecture including a second scan compressor/decompressor configuration $MIN_{CONF}$ connected to a subset of the pins.

The first scan architecture is enabled for executing a scan test with low time, i.e., at package level, and the second scan architecture is enabled for executing a scan test with high parallelism, i.e., at wafer level.

For clarity, in the annexed figures and in the following description the compressors and decompressors of the first scan compressor/decompressor configuration $MAX_{CONF}$ are respectively indicated with reference numerals 4, 14 and the compressors and decompressors of the second scan compressor/decompressor configuration $MIN_{CONF}$ are respectively indicated with reference numerals 3, 13.

According to the improved architecture it is possible to significantly increase the parallelism during the electrical wafer level test by probing a very limited number of pins (e.g., only sixteen pins), for reducing the cost of the embedded test Flash that generally takes several seconds. At the same time, according to the improved architecture, it is possible to apply the digital patterns to test the digital logic using a classical scan approach wherein all the pins are used.

In a typical test flow provided by the prior art approaches there is just a compressor architecture that is substantially equivalent to the compressor/decompressor configuration $MAX_{CONF}$ of the present invention, used both for the electrical wafer level test and the package level test.

The proposed approach avoids having to test the electrical wafer level with the compressor/decompressor configuration $MAX_{CONF}$ using for this purpose the compressor/decompressor configuration $MIN_{CONF}$. The compressor/decompressor configuration $MIN_{CONF}$ allows a significant reduction in the test data volume, so it is possible to reach good coverage among different faults family (mainly stuck-at and transition) also in the electrical wafer level steps with the actual limitation of the low cost tester (mainly the vectors memory).

Moreover, with the compressor architecture, the compressor/decompressor configuration $MAX_{CONF}$ may be used to execute the package level tests. This approach significantly reduces the test time at package level test because substantially all pins are contacted, since a high parallelism is not necessary at package level test. The embedded Flash memory portion is not tested anymore in a deep mode as in the electrical wafer level test and the big amount of the test time is related just to the digital logic.

At the same time, having high compression ratio architecture specific patterns that are able to cover a new family of faults may be applied with very high coverage (bridging, transition and path delay faults) on other than the classical stuck-at fault without requiring a very big test equipment vector memory. The architecture of the two compressors architectures thus satisfies the constraints of the test parallelism and the test time in both the electrical wafer level and package level tests.

This optimization would not be possible using only one compression architecture, as in the prior art. It worth while to note that the overhead in term of area of this multi scan architecture is really negligible since the largest part of the circuit area is occupied by the compressor/decompressor configuration $MAX_{CONF}$ that is already implemented in the prior art approaches.

In other words, the addition of the compressor/decompressor configuration $MIN_{CONF}$ does not introduce overhead in term of area, since it may be realized by simple and low area circuitry. Moreover, more than one compressor/decompressor configuration may be introduced, in addition to the compressor/decompressor configurations $MAX_{CONF}$ and $MIN_{CONF}$ in order to support tests at different levels of parallelism and test time.

As already stated, this approach is possible because the overhead in term of area of the additional compressor/decompressor configurations is negligible.

Figure 7:
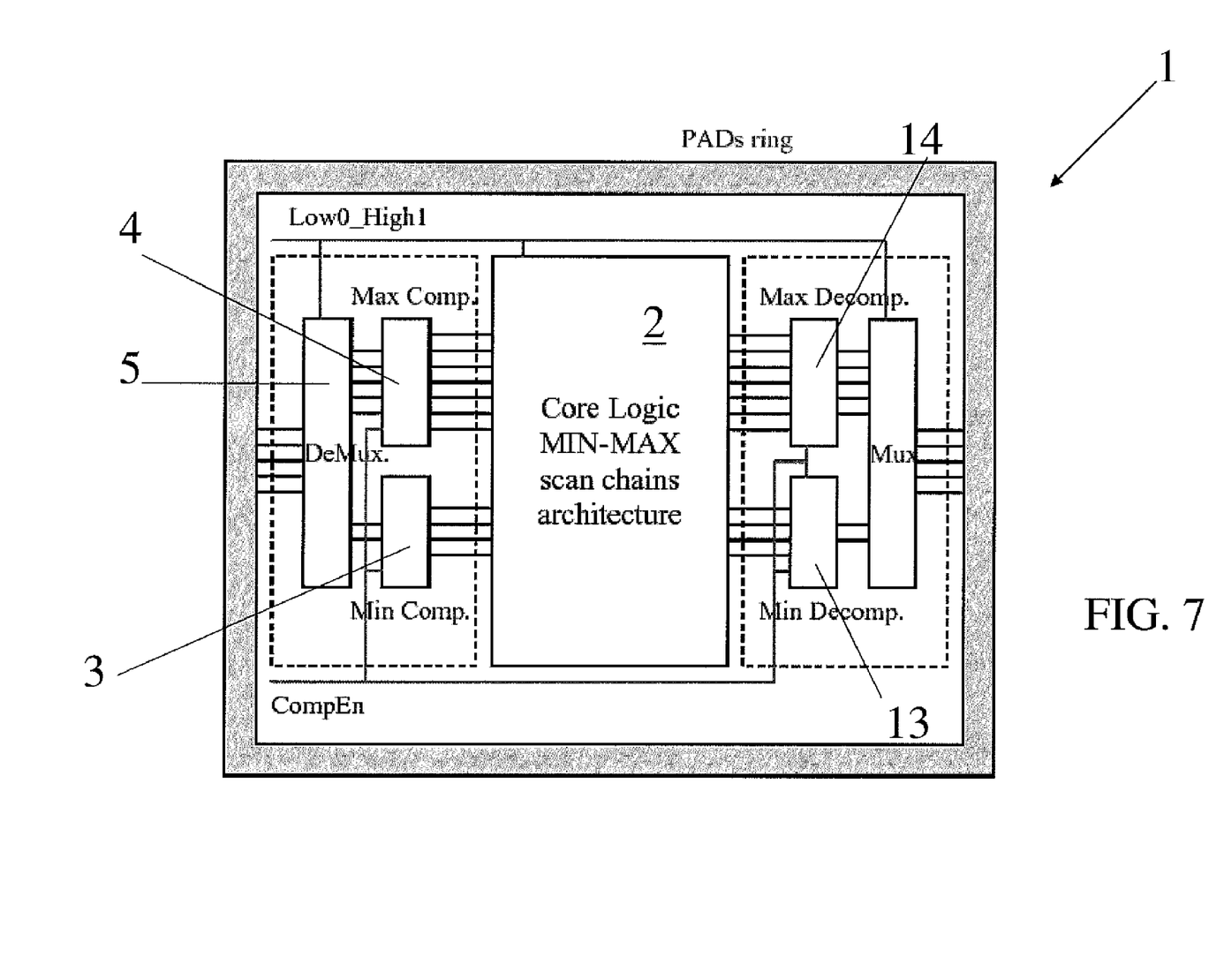
FIG. 7 is a schematic view of the TOP level structure of FIG. 6.

In FIG. 7 the final architecture according to the invention is shown. Without limiting the scope of protection of the present invention, the final architecture represented in FIG. 7 may be implemented with the design for testability compiler according to the software tool Synopsys.

This is not a limitation since conventional software tools could be used to implement the at least two compressor/decompressor configurations $MAX_{CONF}$ and $MIN_{CONF}$. This implementation has been considered as a test case to validate the quality of the inventive approach using the CAD tool currently in use.

The first scan architecture or the second scan architecture is selectively enabled by an external control signal, hereafter indicated as Low0_High1. The external control signal Low0_High1 may be received on an input pin of the chip, schematically represented in the attached figures with reference numeral 10. As may be appreciated, a control signal Low0_High1 selects the architecture that has to be enabled in the Core Logic 2. So, one or the other compressors is selectively enabled by the control signal.

More particularly, the Core Logic 2 comprises a plurality of scan chains that, according to a value of the Low0_High1 and according to the number of pins used for the test, are configured for executing the test with high parallelism or the test with reduced test time.

For example, according to the first scan compressor/decompressor configuration $MAX_{CONF}$ the scan chains are short to reduce the test time while in the second scan compressor/decompressor configuration $MIN_{CONF}$ the scan chains are long to improve the test parallelism.

Figure 6:
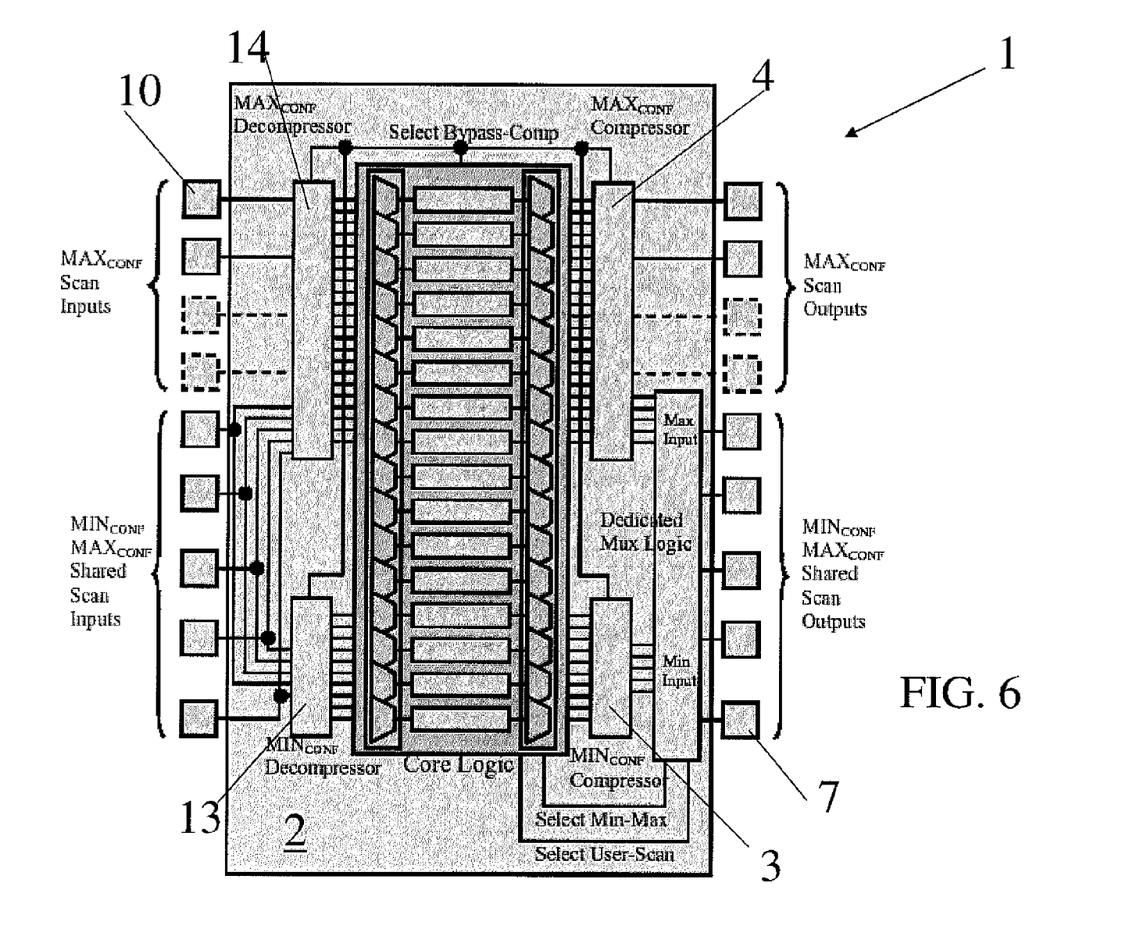
FIG. 6 schematically shows the TOP level structure of FIG. 3 including both the compressor/decompressor configuration $MAX_{CONF}$ of FIG. 5 and a compressor/decompressor $MIN_{CONF}$ configuration according to the present invention.

As schematically represented in FIG. 6, this selection depends on the external pins 10 probed/contacted and configures the scan chains 6, 8 on the specific scan chains input/output pins 10, 7.

An additional control signal CompEn selects instead the behavior of the enabled compressor logic that has been selected using the Low0_High1 signal. More particularly, a first value of the control signal CompEn provides configuration of the logic selected via the Low0_High1 signal in a noncompressed mode for executing scan tests in a standard and noncompressed mode. In this case the compressor/decompressor are not used and the number of scan chains are not increased.

On the contrary, according to a second value of the control signal CompEn, the logic selected via the Low0_High1 signal is used in a compressed mode for executing the compressor/decompressor and increasing the number of scan chains.

Different couples of input decompressor multiplexers and output XOR logic compressors are provided depending on the number of external scan chains, with proper connections to input and output PADs 10, 7, and mode selectable by the external control signal.

Each of the two compressor/decompressor configurations $MIN_{CONF}$ or $MAX_{CONF}$ allow two operating modes that are enabling the compressor or simply bypassing it depending on the CompEn value.

In the first mode, the compressor 3 or 4 is used to reduce the test time and data volume by using the selected compressor/decompressor configurations (Min/Max). In the second mode the compressor may be bypassed to perform special debug, for instance a bitmapping capability without any loss of data.

In general, these two signals Low0_High1 and CompEn can be directly connected to the pins 10 or they can be generated internally (using for example a JTAG IEEE 1149.1 standard architecture). In this manner it is possible to enable the compressor 3 or 4 with one of the two signals.

Referring now in mode details the operating activities of the improved scan compression architecture 1 with an example given only for illustrative purposes, is not limiting in the following: in the number of scan compressions architecture used, nor in the set of pins associated to one or the other architecture, nor in the number of scan chains associated to the set of pins, nor in the device intended to be tested with one or the other architectures, nor in the number or in the sequence of phases executed to implement the two or more scan architecture.

The following example is given only to schematically show an implementation of an architecture comprising at least two different architectures including respective compressor/decompressor configurations connected to respective predetermined set of pins associated to respective scan chains.

More particularly, this example is given to show a possible implementation of the two architectures wherein the first architecture is enabled for executing a scan test with a low time, especially indicated for package level test. The second scan architecture is enabled for executing a scan test with high parallelism, especially indicated at wafer level.

As already discussed, each one of the two modes will implement a scan compression architecture which is targeted to a specific test requirement. For example, one mode will include five external scan chains 6 suitable for electrical wafer level testing step, and is assigned to the compressor/decompressor configuration $MIN_{CONF}$.

The second mode will include twenty-three external scan chains 8 suitable for package level test, and is assigned to the compressor/decompressor configuration $MAX_{CONF}$ 4. The configurations above are given as example and do not limit the scope of the invention. The twenty-three external scan chains 8 could be used for the electric wafer level test, and the five external scan chains 6 for the package level test.

A modification of the standard design for testability compiler flow is necessary for the implementation of the dual scan architecture of the present invention.

More detail will now be provided in the modifications of the standard flow of Synopsys design for testability compiler tool that shall be performed in order to achieve the above described design for testability structure. The starting point is the Scan-Ready net list at the TOP level.

The first step passes from having grouped analog and digital logic in the single CORE logic block 2 in order to have only this block and the I/O PADs 10 and 7 at TOP level. In this specific case, the Test Access Mechanism (TAM) is based on a JTAG IEEE 1149.1 protocol, so dedicated internal control signals properly force the needed I/O PADs according to the selected test mode, compressor/decompressor configuration $MAX_{CONF}$ or compressor/decompressor configuration $MIN_{CONF}$.

The control signals, embedded into the CORE logic 2, need to be used at TOP level in the following steps. In order to overcome this problem, dedicated output ports have been added to the CORE logic block 2 and connected to these internal control signals.

Figure 3:
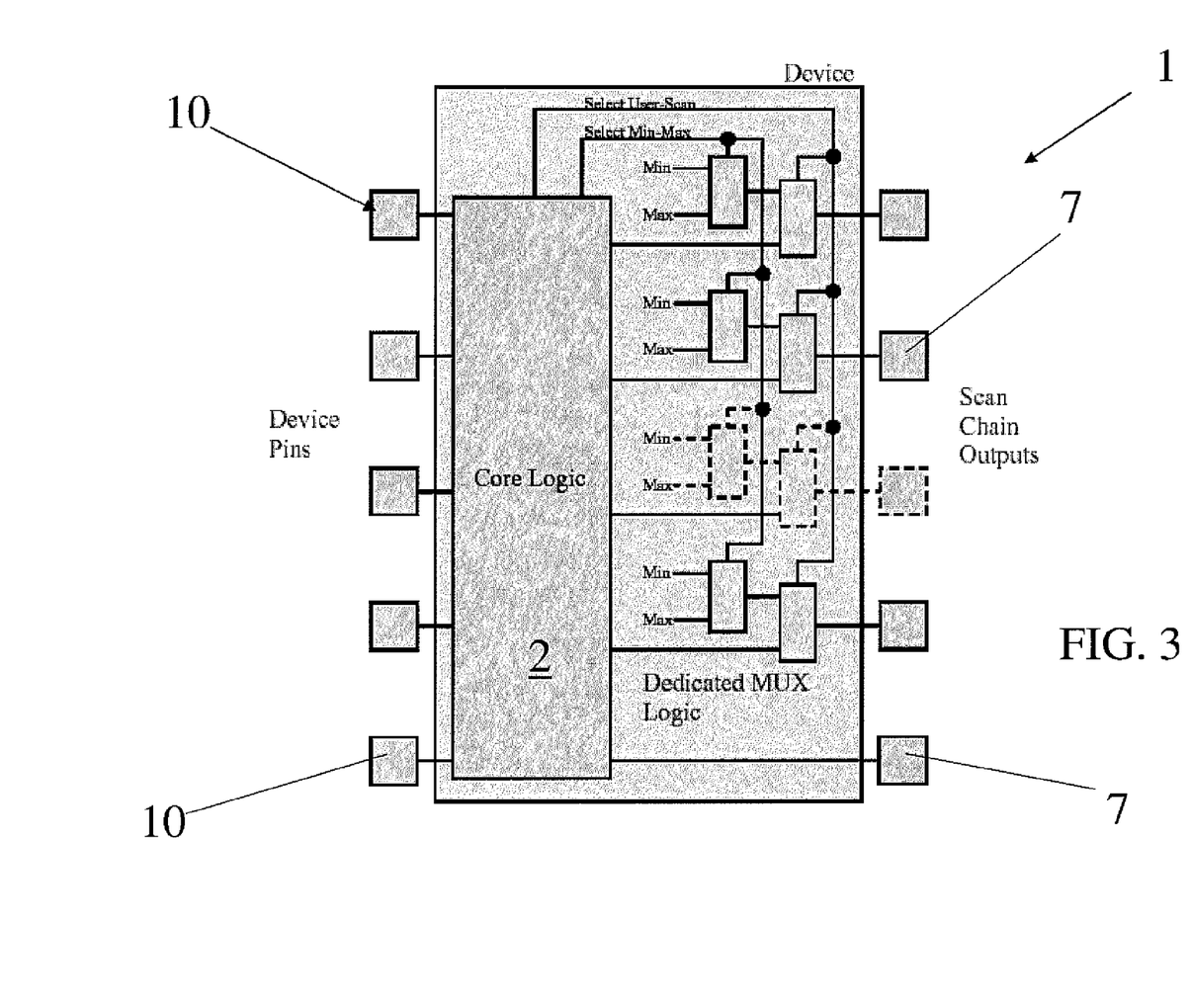
FIG. 3 schematically shows a scan compression architecture including a TOP level modified to include share output multiplexer logic according to the present invention.

A second optional step requires a manual modification of the TOP level of the device to insert the scan data out multiplexer, connected to the output PADs shared between compressor/decompressor configuration $MAX_{CONF}$ 4 and compressor/decompressor configuration $MIN_{CONF}$. This is an optional step that could be avoided considering two separate groups of output PADs 7 for the two modes. In FIG. 3 the TOP level structure resulting from this operation is reported.

A third step provides for the insertion of the reconfigurable scan chains into the CORE block 2. The correct number of internal scan chains for each one of the two modes may be selected according to the compressor factor formula for a design for testability scan architecture.

As schematically represented in FIG. 6 and only, for example, for the compressor/decompressor configuration $MAX_{CONF}$ the number of external scan chains has been set to twenty-three, and a compression factor 15× has been chosen. This is while for the compressor/decompressor configuration $MIN_{CONF}$ the number of external scan chains has been set to five, and a compression factor of 4× has been chosen.

Figure 4:
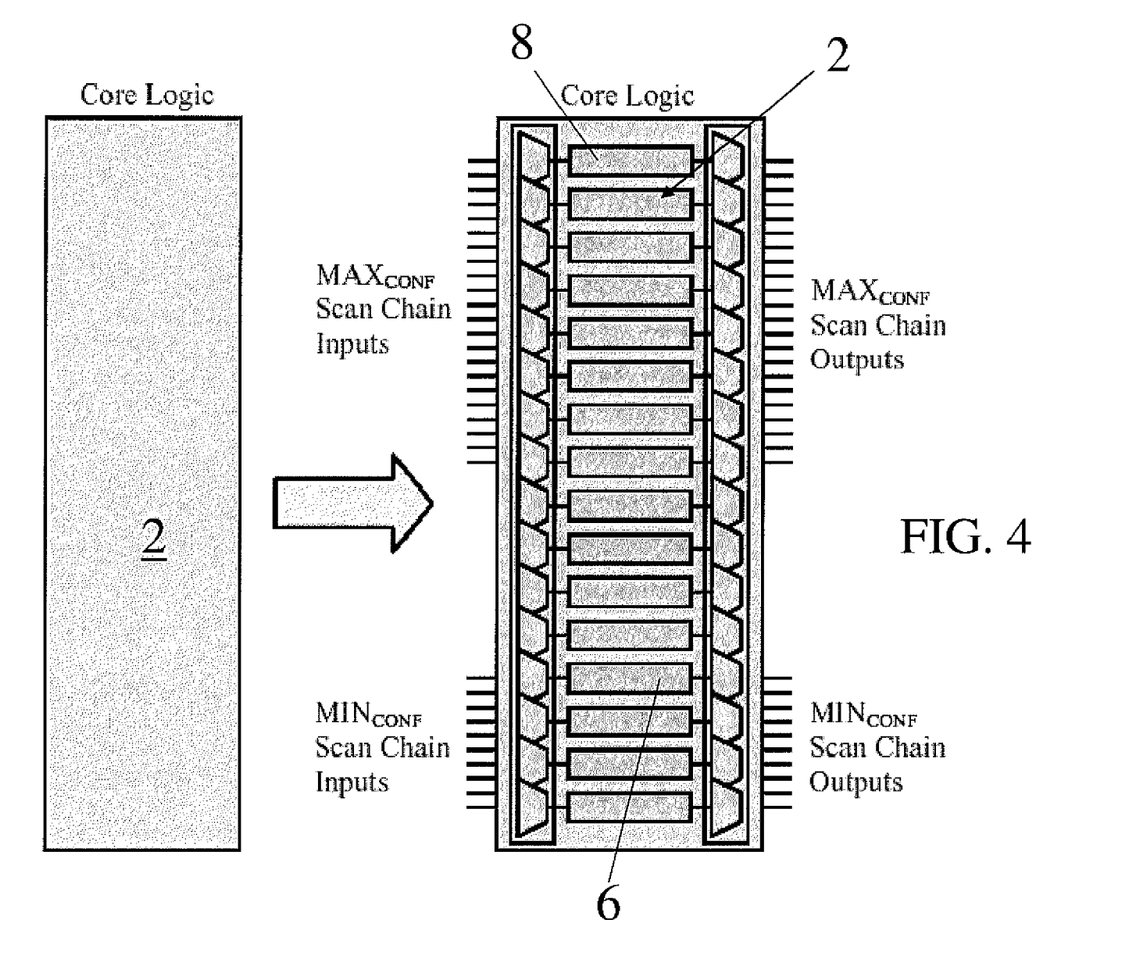
FIG. 4 schematically shows a CORE logic incorporated into the architecture according to the present invention.
Figure 5:
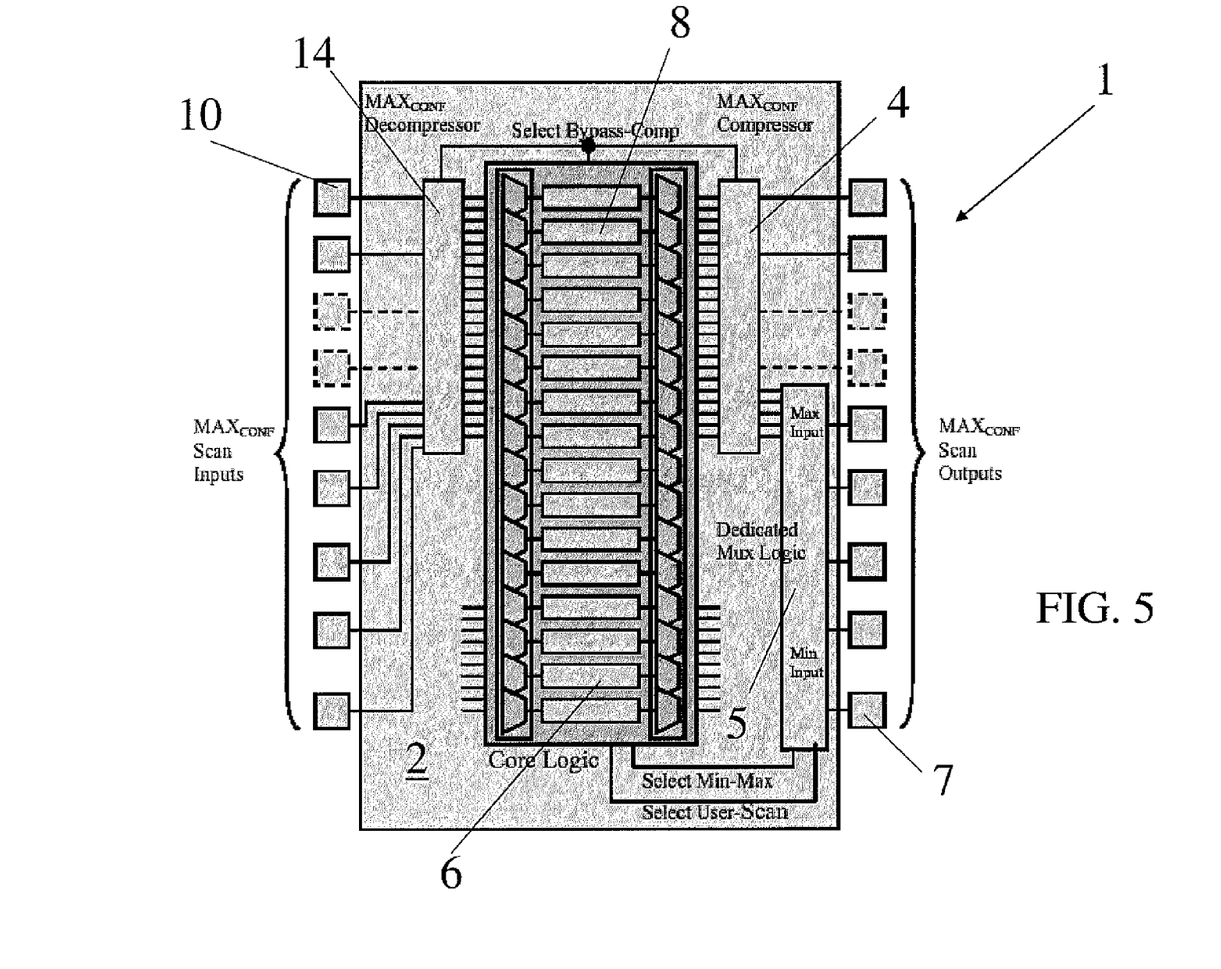
FIG. 5 schematically shows the TOP level structure of FIG. 3 including a compressor/decompressor configuration $MAX_{CONF}$ architecture according to the present invention.

In FIG. 4 the resulting CORE block 2 is shown. The TOP level circuit so modified to introduce the scan data out multiplexer (according to the second step) includes the compressor/decompressor configuration $MAX_{CONF}$ only, obtained in the previous step, can now be used to run the design for testability compiler to configure the design for testability architecture that fits the requested compression ratio of the compressor/decompressor configuration $MAX_{CONF}$ mode. The circuit achieved at the end of this step is shown in FIG. 5.

Using the TOP level circuit above as modified, it is now possible to run the design for testability compiler, similarly to the previous step, to configure the design for testability architecture compliant to the compression ratio of the compressor/decompressor $MIN_{CONF}$ configuration.

In this step, besides performing the insertion of the compressor/decompressor $MIN_{CONF}$ configuration, the already implemented compressor/decompressor configuration $MAX_{CONF}$ shall be preserved. The use of a test model, the use of the scan insertion options and the steps flow previously described allow preservation of the inserted compressor architecture. The final circuit is shown in FIG. 6.

The test access mechanism (TAM) now described is based on a JTAG IEEE 1149.1 protocol, included into the core logic and not represented in the annexed figure because it is conventional. According to FIG. 6, three control signals have been extracted, using dedicated or multiplexed external pins to control the functionality of the dual scan architecture.

A first signal "select user-scan" is a global scan enable used to configure the pins to be received by the compressor/decompressor configuration, when the scan architecture needs to be enabled for the test, or to configure the pins when the package has been tested and delivered to the user. A second signal "select min-max" selects one of the two modes, along with the scan chain outputs to be connected to the proper output PADs in the dedicated multiplexer logic.

A third and last signal "select bypass-comp" enables the proper design for testability compressor architecture. In case this third signal "select bypass-comp" is not enabled, the standard scan chain is configured.

The compressor/decompressor configuration $MIN_{CONF}$ for electrical wafer level test allows using low cost test equipment because of a consistent reduction of data volume, which instead could be too large to be practically loaded if a compressed architecture were not used. On the other hand, a low parallelism is obtained using the compressor/decompressor configuration $MAX_{CONF}$.

Advantageously, the improved scan compression architecture provides at least two different architecture. A first scan architecture includes a first scan compressor/decompressor configuration $MAX_{CONF}$ that is connected to a first predetermined set of pins. More particularly, such a set of pins comprises all the pins for testing the entire package in low time. The first scan architecture includes a great number of short scan chains for executing the package level test in low time. Due to the large number of scan chains the first architecture is supported by a complex circuit area. The first scan architecture is substantially a conventional architecture used for package level test and it comprises conventional complex circuit area.

The second scan architecture includes a second scan compressor/decompressor configuration $MIN_{CONF}$ connected to a subset of pins. The second scan architecture includes a low number of long scan chains for executing the electrical wafer level test with high parallelism. Advantageously, due to the low number of scan chains, the second architecture is supported by a simple circuit area.

Since the circuit area for the second scan architecture is simple, an additional scan architecture including an additional scan compressor/decompressor configuration connected to a different subset of pins may be provided. The additional scan architecture includes a number of long scan chains, different from the low number of scan chains associated to the second scan architecture for executing the test with predetermined parallelism and test time.

Also, the additional scan architecture comprises a low number of scan chains, longer than the scan chains associated to the first scan architecture, so that the additional architecture is supported by a simpler circuit area than the circuit area associated to the first architecture. Advantageously, the present invention provides, with an additional and noncomplex circuit area, to obtain different levels of parallelism for testing on the electric wafer level.

The multi-mode and dual scan compression architecture above described can be effectively used to overcome the mentioned technical problem, exploiting a double mode architecture that trades off between the opposite requests of high parallelism required by some test, for instance during the electrical wafer level, and low parallelism required by some others tests, for instance the package level test.

Advantageously, the improved scan compression architecture of the present invention overcomes the current limitation of design for testability compiler tools, reducing the testing cost, both in terms of test time and test data volume for complex system-on-chip ICs and, at the same time, improving the parallelism of the test.

That which is claimed:

1. A scan compression architecture for a design for a test compiler used in a system-on-chip software design tool comprising:
   a plurality of pins;
   a first scan configuration architecture comprising a first scan compressor/decompressor configuration connected to said plurality of pins; and
   a second scan architecture comprising a second scan compressor/decompressor configuration connected to a subset of said plurality of pins;
   said first scan architecture being enabled for executing a first scan test with a lower test time as compared to executing the first scan test with said second scan architecture, and said second scan architecture being enabled for executing a second scan test with a higher parallelism as compared to executing the second scan test with said first scan architecture.

2. A scan compression architecture according to claim 1 wherein said first scan architecture and said second scan architecture are selectively enabled by an external control signal.

3. A scan compression architecture according to claim 2 wherein said plurality of pins comprises an input pin; and wherein the external control signal is received on the input pin.

4. A scan compression architecture according to claim 1 wherein each of said first and second scan compressor/decompressor configurations is enabled or bypassed for providing two corresponding operating modes.

5. A scan compression architecture according to claim 1 wherein said plurality of pins comprises a plurality of input and output pins; and further comprising a single logic core connected to said plurality of input and output pins; and wherein said first scan compressor/decompressor configuration comprising a first plurality of scan chains, and said second scan compressor/decompressor configuration comprising a second plurality of scan chains.

6. A scan compression architecture according to claim 5 further comprising:
   a multiplexer coupled between said plurality of output pins and said single logic core; and
   a demultiplexer coupled between said single logic core and said plurality of input;
   said multiplexer and said demultiplexer being configured based on a control signal for mapping said first and second plurality of scan chains for said first and second scan compressor/decompressor configurations.

7. A scan compression architecture according to claim 6 wherein operating modes of said first and second scan compressor/decompressor configurations are based on an additional control signal.

8. A scan compression architecture according to claim 7 wherein the operating modes include a first operating mode for selecting scan test patterns associated with said first scan compressor/decompressor configuration, and a second operating mode for selecting scan test patterns associated with said second scan compressor/decompressor configuration, said first scan compressor/decompressor configuration being connected to all of said plurality of input and output pins, and said second scan compressor/decompressor configuration being connected to a portion of said plurality of input and output pans.

9. A scan compression architecture according to claim 8 wherein the control signal and the additional control signal are generated internally based on a JTAG IEEE 1149.1 standard architecture.

10. A scan compression architecture according to claim 8 wherein said plurality of input pins are shared between the first and second operating modes.

11. A scan compression architecture according to claim 8 the first operating mode corresponds to a package level test and the second operating mode corresponds to an electrical wafer level test.

12. A scan compression architecture according to claim 1 further comprising at least one additional scan compressor/decompressor configuration connected to a second subset of said plurality of pins, said at least one additional scan compressor/decompressor configuration being enabled for executing a scan test with predetermined parallelism.

13. A test complier comprising:
   a plurality of pins;
   a first scan compressor/decompressor configuration connected to said plurality of pins; and
   a second scan compressor/decompressor configuration connected to a subset of said plurality of pins;
   said first scan compressor/decompressor configuration being enabled for executing a first scan test with a lower test time as compared to executing the first scan test with said second scan compressor/decompressor configuration, and said second scan compressor/decompressor configuration being enabled for executing a second scan test with a higher parallelism as compared to executing the second scan test with said first scan compressor/decompressor configuration.

14. A test complier according to claim 13 wherein said first scan compressor/decompressor configuration and said second scan compressor/decompressor configuration are selectively enabled by an external control signal.

15. A test complier according to claim 14 wherein said plurality of pins comprises an input pin; and wherein the external control signal is received on the input pin.

16. A test complier according to claim 13 wherein each of said first and second scan compressor/decompressor configurations is enabled or bypassed for providing two corresponding operating modes.

17. A test complier according to claim 13 wherein said plurality of pins comprises a plurality of input and output pins; and further comprising a single logic core connected to said plurality of input and output pins; and wherein said first scan compressor/decompressor configuration comprising a first plurality of scan chains, and said second scan compressor/decompressor configuration comprising a second plurality of scan chains.

18. A test complier according to claim 17 further comprising:
   a multiplexer coupled between said plurality of output pins and said single logic core; and
   a demultiplexer coupled between said single logic core and said plurality of input;
   said multiplexer and said demultiplexer being configured based on a control signal for mapping said first and second plurality of scan chains for said first and second scan compressor/decompressor configurations.

19. A test complier according to claim 18 wherein operating modes of said first and second scan compressor/decompressor configurations are based on an additional control signal.

20. A test complier according to claim 19 wherein the operating modes include a first operating mode for selecting scan test patterns associated with said first scan compressor/decompressor configuration, and a second operating mode for selecting scan test patterns associated with said second scan compressor/decompressor configuration, said first scan compressor/decompressor configuration being connected to all of said plurality of input and output pins, and said second scan compressor/decompressor configuration being connected to a portion of said plurality of input and output pins.

21. A test complier according to claim 20 wherein the control signal and the additional control signal are generated internally based on a JTAG IEEE 1149.1 standard architecture.

22. A test complier according to claim 20 wherein said plurality of input pins are shared between the first and second operating modes; and wherein the first operating mode corresponds to a package level test and the second operating mode corresponds to an electrical wafer level test.

23. A method for providing a scan compression architecture through a design for testability compiler used in a system-on-chip, the method comprising:
connecting a first scan compressor/decompressor configuration to a plurality of pins; and
connecting a second scan compressor/decompressor configuration to a subset of the plurality of pins;
the first scan compressor/decompressor configuration being enabled for executing a first scan test with a lower test time as compared to executing the first scan test with the second scan compressor/decompressor configuration, and the second scan compressor/decompressor configuration being enabled for executing a second scan test with a higher parallelism as compared to executing the second scan test with the first scan compressor/decompressor configuration.

24. A method according to claim 23 wherein the first scan compressor/decompressor configuration and the second scan compressor/decompressor configuration are selectively enabled by an external control signal.

25. A method according to claim 24 wherein the plurality of pins comprises an input pin; and wherein the external control signal is received on the input pin.

26. A method according to claim 23 wherein each of the first and second scan compressor/decompressor configurations is enabled or bypassed for providing two corresponding operating modes.

27. A method according to claim 23 wherein the plurality of pins comprises a plurality of input and output pins; and further comprising a single logic core connected to the plurality of input and output pins; and wherein the first scan compressor/decompressor configuration comprises a first plurality of scan chains, and the second scan compressor/decompressor configuration comprises a second plurality of scan chains.

28. A method according to claim 27 wherein the scan compression architecture further comprises a multiplexer coupled between the plurality of output pins and the single logic core; and a demultiplexer coupled between the single logic core and the plurality of input; the multiplexer and the demultiplexer being configured based on a control signal for mapping the first and second plurality of scan chains for the first and second scan compressor/decompressor configurations.

29. A method according to claim 28 wherein operating modes of the first and second scan compressor/decompressor configurations are based on an additional control signal.

30. A method according to claim 29 wherein the operating modes include a first operating mode for selecting scan test patterns associated with the first scan compressor/decompressor configuration, and a second operating mode for selecting scan test patterns associated with the second scan compressor/decompressor configuration, the first scan compressor/decompressor configuration being connected to all of the plurality of input and output pins, and the second scan compressor/decompressor configuration being connected to a portion of the plurality of input and output pins.

31. A method according to claim 30 wherein the plurality of input pins are shared between the first and second operating modes; and wherein the first operating mode corresponds to a package level test and the second operating mode corresponds to an electrical wafer level test.

* * * * *

UNITED STATES PATENT AND TRADEMARK OFFICE
CERTIFICATE OF CORRECTION

PATENT NO. : 7,702,983 B2  Page 1 of 1
APPLICATION NO. : 11/744631
DATED : April 20, 2010
INVENTOR(S) : Casarsa It is certified that error appears in the above-identified patent and that said Letters Patent is hereby corrected as shown below:

| | |
|---|---|
| Column 1, Line 44 | Delete: "compress"<br>Insert: --and compresses-- |
| Column 2, Line 47 | Delete: "deign"<br>Insert: --design-- |
| Column 2, Line 63 | Delete: "deign"<br>Insert: --design-- |
| Column 5, Line 20 | Delete: "It worth"<br>Insert: --It is worth-- |
| Column 5, Line 21 | Delete: "term"<br>Insert: --terms-- |
| Column 5, Line 35 | Delete: "term"<br>Insert: --terms-- |
| Column 6, Line 37 | Delete: "mode details"<br>Insert: --more detail-- |
| Column 10, Line 4 | Delete: "pans"<br>Insert: --pins-- |

Signed and Sealed this

Seventh Day of September, 2010

David J. Kappos
*Director of the United States Patent and Trademark Office*